United States Patent
Ge et al.

(10) Patent No.: US 10,381,805 B2
(45) Date of Patent: Aug. 13, 2019

(54) VERTICAL CAVITY SURFACE EMITTING LASER (VCSEL) REGULAR LATTICE-BASED LASER SPECKLE PROJECTOR

(71) Applicant: Ningbo Yingxin Information Technology Co., Ltd., Ningbo (CN)

(72) Inventors: Chenyang Ge, Ningbo (CN); Huimin Yao, Ningbo (CN); Yanhui Zhou, Ningbo (CN)

(73) Assignee: NINGBO YINGXIN INFORMATION TECHNOLOGY CO., LTD., Ningbo (CN)

(*) Notice: Subject to any disclaimer, the term of this patent is extended or adjusted under 35 U.S.C. 154(b) by 0 days.

(21) Appl. No.: 16/102,629

(22) Filed: Aug. 13, 2018

(65) Prior Publication Data

US 2019/0181618 A1   Jun. 13, 2019

(30) Foreign Application Priority Data

Dec. 8, 2017   (CN) .......................... 2017 1 12929578

(51) Int. Cl.

| | |
|---|---|
| *H04N 9/31* | (2006.01) |
| *G02B 27/48* | (2006.01) |
| *H01S 5/42* | (2006.01) |
| *H01S 5/00* | (2006.01) |
| *G02B 26/00* | (2006.01) |
| *G03B 21/20* | (2006.01) |
| *G01B 11/25* | (2006.01) |

(52) U.S. Cl.
CPC .......... *H01S 5/423* (2013.01); *G01B 11/2513* (2013.01); *G02B 26/008* (2013.01); *G02B 27/48* (2013.01); *G03B 21/204* (2013.01); *H01S 5/005* (2013.01); *H04N 9/3161* (2013.01)

(58) Field of Classification Search
CPC .. G02B 27/48; G02B 26/008; G01B 11/2513; G03B 21/204; H01S 5/005
See application file for complete search history.

(56) References Cited

U.S. PATENT DOCUMENTS

| | | | | |
|---|---|---|---|---|
| 6,975,294 | B2 * | 12/2005 | Manni | .................... G02B 27/48 345/32 |
| 9,946,089 | B2 * | 4/2018 | Chen | .................. G03B 21/2033 |

(Continued)

*Primary Examiner* — William C. Dowling
(74) *Attorney, Agent, or Firm* — Dragon Sun Law Firm, PC; Jinggao Li, Esq.

(57) ABSTRACT

The present disclosure provides a VCSEL regular lattice-based laser speckle projector, comprising a VCSEL regular light-emitting lattice, a collimator, a diffractive optical element, an X-Y direction driving circuit, and a lattice display control module; multiple frames of different coded patterns are outputted by driving the light-emitting particles on the VCSEL regular light-emitting lattice to thereby implement a time-space labeling to the target object or projection space, and finally three-dimensional depth measurement of the target object is implemented through a depth decoding algorithm. Compared with the traditional structured-light space coding technology, the projector of the present disclosure facilitates implementation of time-space coding, such that a higher precision, robustness, and antijamming capability may be achieved during the process of depth decoding for the three-dimensional measurement.

10 Claims, 6 Drawing Sheets

(56) References Cited

U.S. PATENT DOCUMENTS

2007/0153862 A1* 7/2007 Shchegrov ........... G02B 27/102
            372/50.124
2019/0041660 A1* 2/2019 Ahmed ................. G02B 27/48

* cited by examiner (a)

VERTICAL CAVITY SURFACE EMITTING LASER (VCSEL) REGULAR LATTICE-BASED LASER SPECKLE PROJECTOR

CROSS-REFERENCE TO RELATED APPLICATION

This application claims the priority to Chinese Patent Application No. 2017112929578, filed Dec. 8, 2017 in the State Intellectual Property Office of P.R. China, which is expressly incorporated by reference herein in its entirety.

FIELD

The present disclosure generally relates to the field of computer vision, depth perception, and laser imaging, and more particularly to a VCSEL regular lattice-based laser speckle projector.

BACKGROUND

As a hotspot for researches and application developments in the field of computer vision, a depth perception technology is intended for perceiving shape and distance information of a spatial object. Compared with a binocular stereoscopic camera, a structured light-based active vision depth perception technology may acquire depth information of an image more accurately, and the depth image information acquired thereby has the following advantages: a higher stability and reliability, insusceptibility to ambient light, a simple stereoscopic matching process, and a low algorithm computation complexity, etc. Specifically, a laser speckle projector is one of key devices applying the structured light depth perception technology, and the coded pattern projected thereby will directly affect the complexity of depth decoding computation as well as the precision and resolution of depth measurement.

Compared with a light-emitting diode LED and a laser diode LD, a Vertical Cavity Surface Emitting Laser (VCSEL) has an optical cavity oriented perpendicular to a semiconductor wafer such that it may emit light from a surface; the VCSEL has advantages such as a smaller size, a circular output light spot, a single longitudinal mode output, a lower threshold current, a lower price, and ease to be integrated into a large-area array, etc.; therefore, it has been widely applied in fields of optical communication, optical interconnects, and optical storage, etc.

Structurally, the laser speckle projector mainly comprises a light source, a collimator and/or a Diffractive Optical Element (DOE), wherein most laser speckle projectors exploit a single point light source to emit light vertically or to emit light laterally in combination with a 45° (45 degree) reflection, and thus has problems such as a large size, a low photoelectric conversion efficiency, and a large temperature drift effect, etc.; some laser speckle projectors adopt an irregular random VCSEL lattice arrangement to project a basic coded pattern; the basic coded pattern is projected after being duplicated by the diffractive optical element DOE; its lattice arrangement is a random light-emitting lattice and thus has problems that the precision of lattice arrangement position is not high enough, the lattice production density is limited, and the product yield is low; moreover, when the random light-emitting lattice as a basic coded pattern is duplicated and spliced through the DOE, the edge lattices of the pattern easily overlap or are too sparse, causing that the finally formed laser speckle coded pattern is largely discrepant from the designed coded pattern. Besides, the speckle coded patterns projected by existing laser speckle projectors are substantially fixed and invariable; when they are used for space coding a target object or a projection space, they are largely susceptible to ambient light during a structured light depth perception process, which is disadvantageous to improve the accuracy and robustness of depth measurement.

Therefore, a heretofore unaddressed need exists in the art to address the aforementioned deficiencies and inadequacies.

SUMMARY

To address the above problems existing in the prior art, the present disclosure provides a Vertical Cavity Surface Emitting Laser (VCSEL) regular lattice-based laser speckle projector to produce a VCSEL regular light-emitting lattice; by driving different light-emitting spots with an X-Y direction driving circuit, multi-frame different coded patterns are generated in time division as basic coded patterns; then, after collimation by the collimator, each frame of basic coded patterns is duplicated and spliced by the diffractive optical element DOE to generate a laser speckle coded pattern with a large view-of-angle which, after being projected, realizes time-space labeling of the target object or projection space. The laser speckle projector in the present disclosure may not only improve the production yield, light-emitting efficiency, and density of the VCSEL light-emitting spots and facilitate accurate production of the coded patterns, but also may realize time-space coding of the structured light and improve the accuracy, robustness, and anti-jamming capability of the structured light three-dimensional depth measurement.

Specifically, the present disclosure provides a Vertical Cavity Surface Emitting Laser (VCSEL) regular lattice-based laser speckle projector, comprising:

a VCSEL regular light-emitting lattice, VCSEL light-emitting particles, a collimator, an X-Y direction driving module, and a display control module, wherein:

the VCSEL regular light-emitting lattice is formed based on a same VCSEL light-emitting substrate or a plurality of VCSEL light-emitting substrates, a plurality of VCSEL light-emitting particles being regularly arranged on the one or more light-emitting substrates;

the collimator performs collimation processing to light rays emitted by all VCSEL light-emitting particles on the VCSEL light-emitting substrate, the X-Y direction driving module is configured for constant-current driving the VCSEL light-emitting particles regularly arranged on the VCSEL light-emitting substrate in an X-Y axis direction, and the display control module selects, according to a coding rule, part of the VCSEL light-emitting particles, as a batch of particles, in conformity with a current frame coding rule or within a certain region and informs the driving module to drive for displaying the batch of selected VCSEL light-emitting particles.

the display control module selects, according to the coding rule, by batches, VCSEL light-emitting particles of a certain region; wherein light-emitting particles that are turned on in a preceding batch of selected regions are automatically turned on in a subsequent batch selection operation.

The projector further comprises:

a diffractive optical element (DOE) that duplicates and splices the basic coded pattern emitted by the VCSEL light-emitting substrate.

The laser speckle projector of the present disclosure outputs multiple frames of different coded patterns by driving the light-emitting particles on the VCSEL regular light-emitting lattice to thereby implement a time-space labeling to the target object or projection space, and finally implements three-dimensional depth measurement of the target object through a depth decoding algorithm. Compared with the traditional structured-light space coding technology, the projector of the present disclosure facilitates implementation of time-space coding, such that a higher precision, robustness, and anti-jamming capability may be achieved during the process of depth decoding for the three-dimensional measurement.

BRIEF DESCRIPTION OF THE DRAWINGS

FIG. 3 is a schematic diagram of coding light-emitting particles on the VCSEL light-emitting lattice according to a coding rule in the present disclosure;

DETAILED DESCRIPTION OF EMBODIMENTS

Figure 1:
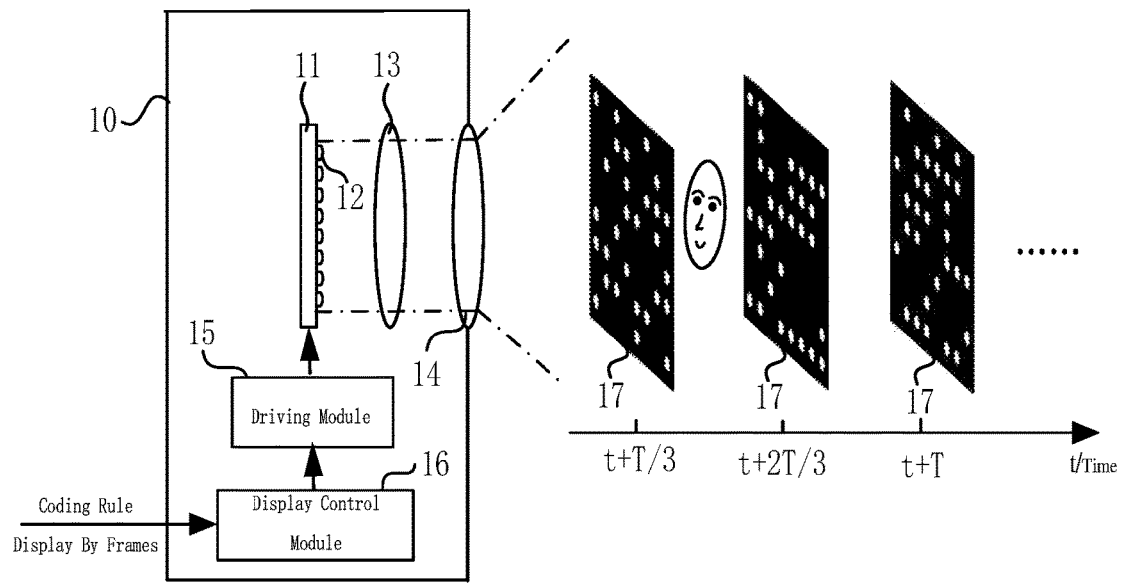
FIG. 1 is a structural schematic diagram of a VCSEL regular lattice-based laser speckle projector.
Figure 2:
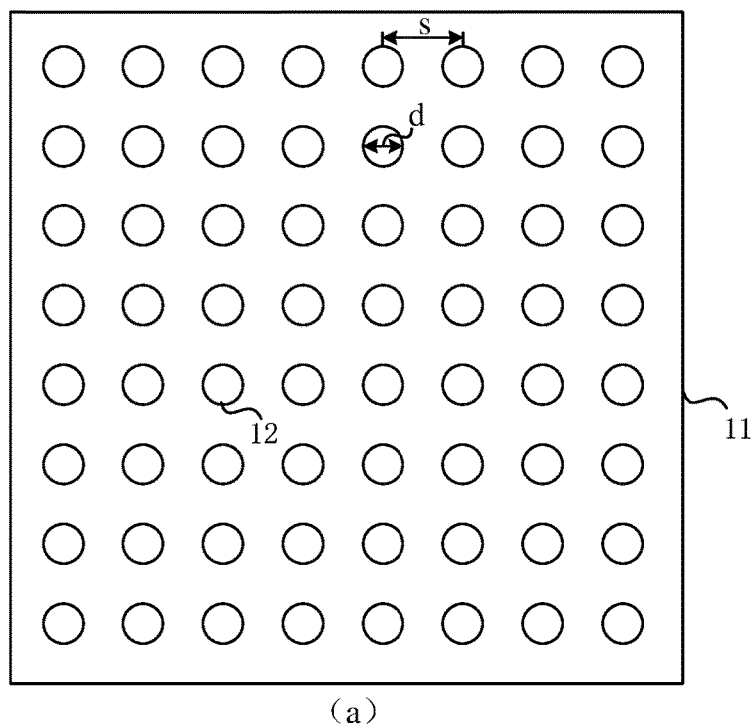
FIG. 2(a) is an embodiment design of arrangement of the VCSEL regular light-emitting lattice according to the present disclosure.
FIG. 2(b) is another embodiment design of arrangement of the VCSEL regular light-emitting lattice according to the present disclosure.
Figure 2:
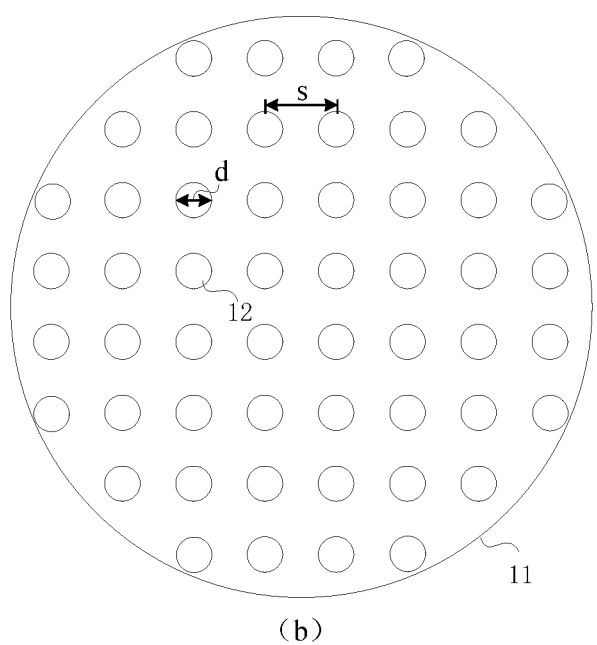
Figure 4:
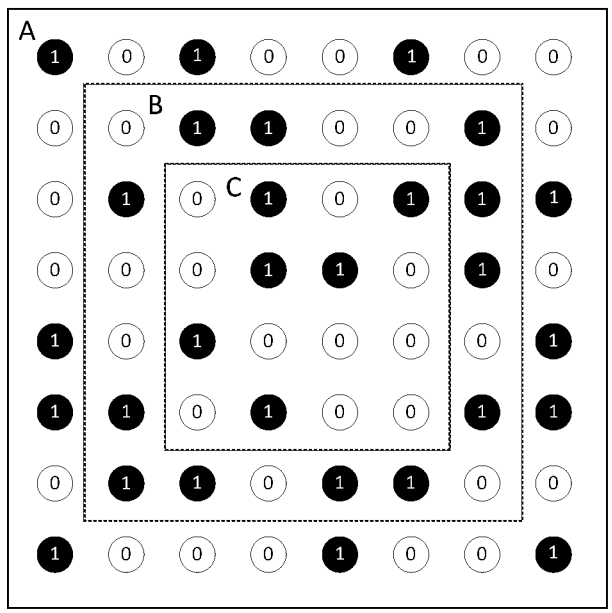
FIG. 4(a) is an embodiment design of driving VCSEL light-emitting particles by regions according to the present disclosure.
FIG. 4(b) is an embodiment design of driving VCSEL light-emitting particles by regions according to the present disclosure.
Figure 4:
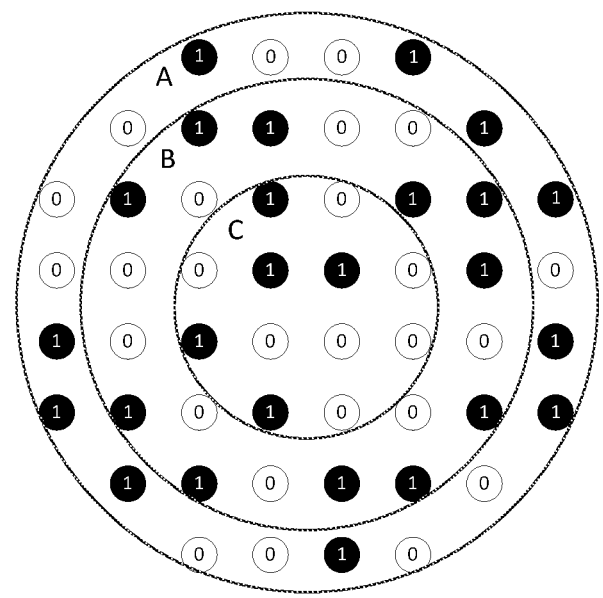

The present disclosure will now be described more fully hereinafter with reference to the accompanying drawings, in which exemplary embodiments of the present disclosure are shown. The present disclosure may, however, be embodied in many different forms and should not be construed as limited to the embodiments set forth herein. Rather, these embodiments are provided so that this disclosure is thorough and complete, and will fully convey the scope of the disclosure to those skilled in the art. Like reference numerals refer to like elements throughout.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding description of the disclosure. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It is appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the disclosure or of any exemplified term. Likewise, the disclosure is not limited to various embodiments given in this specification.

It is understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It is understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the present disclosure.

It is understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It are also appreciated by those of skill in the art that references to a structure or feature that is disposed "adjacent" to another feature may have portions that overlap or underlie the adjacent feature.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It is further understood that the terms "comprises" and/or "comprising," or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It is understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present disclosure belongs. It is further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around," "about," "substantially" or "approximately" shall generally mean within 20 percent, preferably within 10 percent, and more preferably within 5 percent of a given value or range. Numerical quantities given herein are approximate, meaning that the terms "around," "about," "substantially" or "approximately" can be inferred if not expressly stated.

As used herein, the terms "comprise" or "comprising," "include" or "including," "carry" or "carrying," "has/have" or "having," "contain" or "containing," "involve" or "involving" and the like are to be understood to be open-ended, i.e., to mean including but not limited to.

As used herein, the phrase "at least one of A, B, and C" should be construed to mean a logical (A or B or C), using a non-exclusive logical OR. It should be understood that one or more steps within a method may be executed in different order (or concurrently) without altering the principles of the disclosure.

Embodiments of the disclosure are illustrated in detail hereinafter with reference to accompanying drawings. It should be understood that specific embodiments described herein are merely intended to explain the disclosure, but not intended to limit the disclosure.

To provide a more comprehensive illustration of the embodiments of the present disclosure, a plurality of details will be expounded infra. However, to those skilled in the art, it is apparent that the embodiments of the present disclosure may be implemented without these details. In addition, the features in different embodiments described infra may be combined with one another, unless otherwise specifically indicated.

Hereinafter, a projector of the present disclosure will be described in further detail with reference to FIGS. 1-7.

A Vertical Cavity Surface Emitting Laser (VCSEL) regular lattice-based laser speckle projector 10 according to the present disclosure, as shown in FIG. 1, comprises a VCSEL regular light-emitting lattice 11, VCSEL light-emitting particles 12, a collimator 13, an X-Y direction driving module 15, and a display control module 16, wherein:

the VCSEL regular light-emitting lattice 11 may be formed based on a same VCSEL light-emitting substrate or a plurality of VCSEL light-emitting substrates, a plurality of VCSEL light-emitting particles 12 being regularly distributed and arranged on the light-emitting substrate(s), wherein the number of light-emitting particles is an integer (2, 3, 4, . . . , k), and the light-emitting particles are equidistantly arranged with a variable arrangement density; a shape of the formed regular light-emitting lattice 11 may be a square shape, a rectangular shape, a circular shape, a triangular shape, and a polygonal shape, etc.

The collimator 13 performs collimation processing to light rays emitted by all VCSEL light-emitting particles 12 on the VCSEL light-emitting substrate, i.e., causing the light rays emitted from the light source to exit in parallel or to focus according to a certain depth of field. The collimator size should be tightly fit to the light-emitting region size of the light-emitting substrate.

The X-Y direction driving module 15 is configured for constant-current driving the light-emitting particles regularly arranged on the VCSEL light-emitting substrate in an X-Y axis direction, which may select only driving part of the light-emitting particles, but also may change the light-emitting intensity of each light-emitting particle by changing a current magnitude, forming a grayscale layer.

The display control module 16 may select, according to a coding rule, part of VCSEL lighting particles, as a batch of selected particles, in conformity with a current frame coding rule or within a certain region, and inform the driving module 15 to drive for displaying the batch of selected VCSEL light-emitting particles to thereby generate a frame of coded pattern for space coding; the display may also be controlled by multiple frames according to a time-space coding rule. The coding rule may be issued via a standard interface from an external processor.

Figure 5:
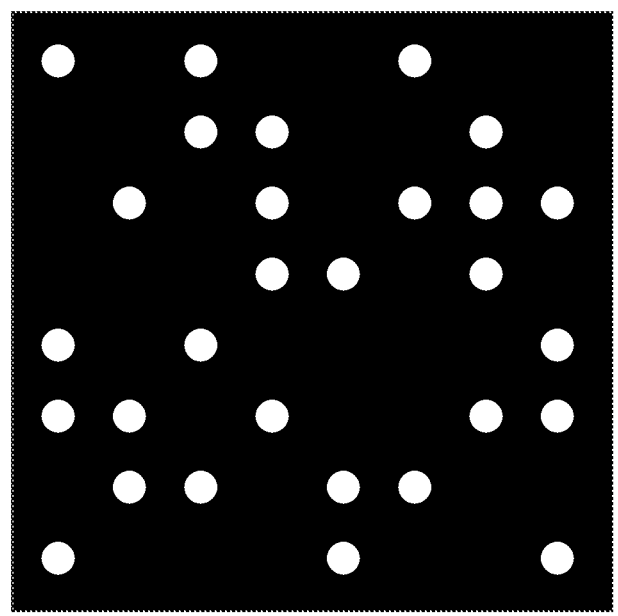
FIG. 5 is a schematic diagram of a random speckle-based VCSEL coded pattern.
Figure 6:
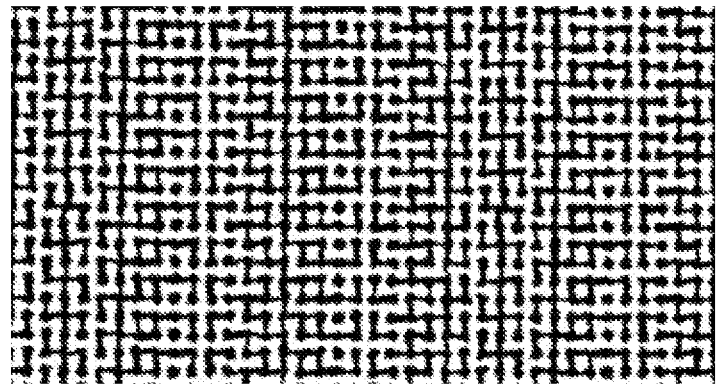
FIG. 6 is a schematic diagram of a VCSEL coded pattern generated in the present disclosure, which is coded based on a regular symbol array.
Figure 7:
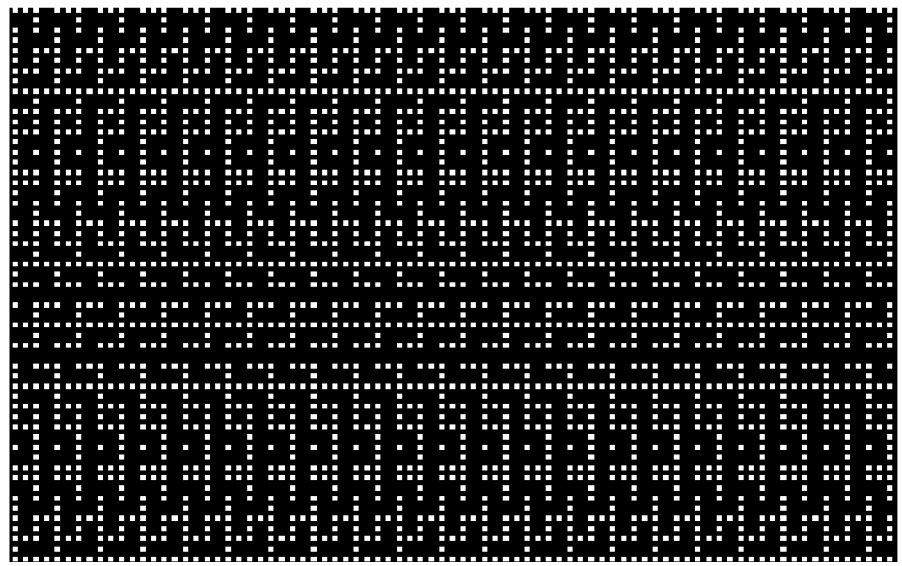
FIG. 7 is a schematic diagram of a VCSEL coded pattern generated in the present disclosure, which is coded based on speckle plus regular symbol array.

Specifically, when the display control module 16 selects, according to a coding rule, part of VCSEL lighting particles in conformity with a current frame coding rule or within a certain region, and informs the driving module 15 to drive for displaying the selected VCSEL light-emitting particles, a certain frame of coded pattern will be projected. This pattern may be composed of random speckles, or composed of regular symbol M-array codes, or composed of speckle plus regular symbol mixed codes; specifically, the speckle coded pattern composed of random speckles is shown in FIG. 5, the speckle coded pattern composed of regular symbol M-array codes is shown in FIG. 6, and the speckle coded pattern composed of speckle plus regular symbol mixed codes is shown in FIG. 7.

The driving module 15 drives part of the VCSEL light-emitting particles 12 in the VCSEL regular light-emitting lattice 11 according to an instruction of the display control module 16; it may also form multiple frames of different basic coded patterns on a time axis; and the coded patterns, after being duplicated and spliced by the collimator 13 and/or DOE 14, finally form a multi-frame speckle time-space coded pattern 17 to be projected on the target object or projection space, thereby time-space coding and labeling the target object. The multi-frame speckle time-space coded pattern as projected at this point may form a coding scheme with multiple frames of patterns on the time axis, e.g., a strip structured light, a phase shift structured light, etc.

In another embodiment, the projector 10 further comprises a diffractive optical element DOE 14. The DOE 14 duplicates the basic coded pattern emitted by the VCSEL light-emitting substrate into m*n blocks (where m and n are all integers such as 1, 2, 3 . . . ) and splices them. The DOE will ensure that the respective duplicated coded patterns, after being spliced, are relatively consistent in contrast, brightness, evenness, distortion condition, splice gap evenness, etc.

As far as the embodiment above is concerned, the apparatus has a basic function: the display control module 16 separately switches on/off and/or controls a light intensity of each light-emitting particle in the regularly arranged VCSEL light-emitting lattice on the light-emitting substrate through the X-Y direction driving module 15 according to the coding rule issued from the external, or simultaneously controls part of all light-emitting particles in conformity with the current frame coding rule, thereby forming a speckle coded pattern composed of VCSEL light-emitting spots in conformity with the current frame shape, such that the light rays emitted by all VCSEL light-emitting particles forming the coded pattern, after being collimated by the collimator, form laser speckles which are more focused and have a higher contrast; the coded pattern is then duplicated and spliced through the diffractive optical device DOE to code and label the target object or projection space. The single-frame speckle coded pattern may be subject to space labeling, and multi-frames of continuous but different speckle coded patterns may be subject to time-space labeling.

Preferably, the VCSEL light-emitting lattice may have a square shape, a rectangular shape, a triangular shape, a polygonal shape or a round shape, etc. The light-emitting lattice is formed based on a same VCSEL light-emitting substrate or a plurality of VCSEL light-emitting substrates.

Preferably, the light-emitting particles are arranged on the light-emitting substrate evenly and regularly, as shown in FIG. 2(a) and FIG. 2(b), where the light-emitting particles are circular light-emitting elements with an aperture being d and evenly distributed on a square or a circular substrate according to a rule that the interval between every two neighboring centers is s.

Preferably, the display control module may separately control each light-emitting particle, i.e., each light-emitting particle has a corresponding switch signal and current intensity signal; a plurality of light-emitting particles may be uniformly controlled, i.e., a plurality of light-emitting particles in a same group only has one switch signal and one current intensity signal, such that they may be turned on or off simultaneously.

Figure 3:
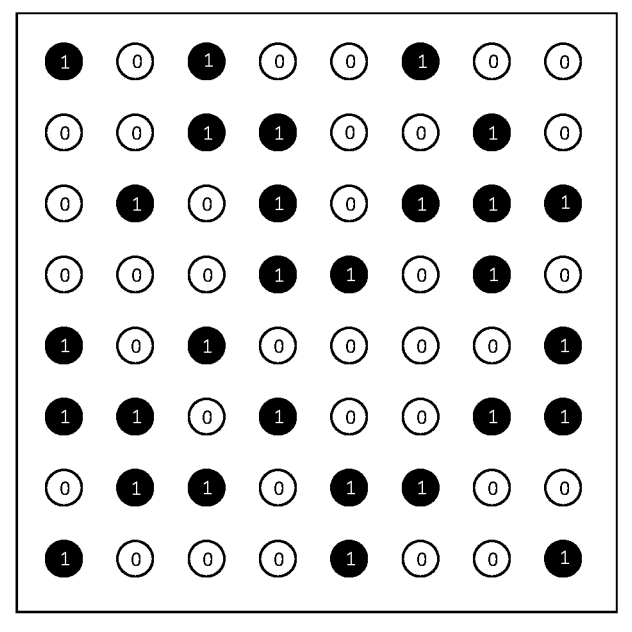

Preferably, the display control module comprises an external communication interface via which a user adjusts turning-on or turning-off of each light emitting element on a light-emitting substrate, thereby generating different shapes of coded patterns. FIG. 3 shows a random speckle pattern that is turned on based on a distribution situation of the light-emitting particles on the light-emitting substrate of FIG. 2(a) and a group of randomly generated two-dimensional arrays (the size of two-dimensional array has a one-to-one-correspondence with the distribution of light-emitting particles; the array only contain 0 and 1, where 0 indicates turning off the light-emitting particles at corresponding positions, and 1 indicates turning on the light-emitting particles at corresponding positions), wherein black dots indicate the turned-on light-emitting particles. FIG. 4(a) and FIG. 4(b) show selecting light-emitting particles in part of regions on the VCSEL light-emitting substrate. Specifically, as shown in FIG. 4(a) and FIG. 4(b), if region C is selected to turn on, only the light-emitting particles labeled 1 in the region C are turned on, corresponding to a projected coded pattern with a small field of view, which helps to solve the power consumption issue; if region B is further selected to turn on, light-emitting particles labeled 1 in the region B are further turned on based on the lighting region C, corresponding to a projected coded pattern with a larger field of view; in an intention to further enlarge the field of view of the coded pattern, region A may be adopted (automatically including regions B and C). By dividing and control the light-emitting particles in different regions, a structured light coding issue that different sizes of field of view are needed in different application scenarios is realized, and the difficulty in reducing power consumption in different application scenarios is solved.

Preferably, the display control module may not only control projecting a fixed coded pattern to label a spatial object, but also may control a plurality of different coded patterns to be output in time division, for time-space labeling of the spatial object.

The present disclosure not only supports structured-light modes generated by different kinds of laser sources, e.g., infrared light, visible light, ultraviolet light, invisible light, etc., but also may use projection solutions with different shapes of light-emitting elements, e.g., a dot shape, a block shape, a cross shape, and a strip shape, etc. The VCSE light-emitting regions that are turned on according to region divisions, as shown in FIGS. 4(a) and 4(b), are not limited to a square shape, a rectangular shape, a circular shape; the number of regions as divided are not limited to blocks A, B, and C; they may also be divided into 2 layers, 3 layers, 4 layers, . . . and n layers; shapes of sub-regions as divided are not limited to regular shapes, which may vary with splicing rules. The present disclosure adopts VCSEL as light-emitting particles, but it may also adopt other light sources such as LED and LD. Therefore, any modifications and improvements without departing from the spirit and scope of the present disclosure should be included within the scope of the claims.

The embodiments above only schematically illustrate the principle of the present disclosure. It should be understood that the modifications and alterations of the arrangements and the details described herein will be obvious to those skilled in the art. Therefore, the present disclosure is not intended to be limited by the scope of the claims, not limited to the specific details of the present disclosure provided to illustrate and describe the embodiments.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A Vertical Cavity Surface Emitting Laser (VCSEL) regular lattice-based laser speckle projector, comprising:
   a VCSEL regular light-emitting lattice, VCSEL light-emitting particles, a collimator, an X-Y direction driving module, and a display control module, wherein:
   the VCSEL regular light-emitting lattice is formed based on a same VCSEL light-emitting substrate or a plurality of VCSEL light-emitting substrates, a plurality of VCSEL light-emitting particles being regularly arranged on the one or more light-emitting substrates,
   the collimator performs collimation processing to light rays emitted by all VCSEL light-emitting particles on the VCSEL light-emitting substrate,
   the X-Y direction driving module is configured for constant-current driving the VCSEL light-emitting particles regularly arranged on the VCSEL light-emitting substrate in an X-Y axis direction, and
   the display control module selects, according to a coding rule, part of the VCSEL light-emitting particles, as a batch of selected particles, in conformity with a current frame coding rule or within a certain region and informs the driving module to drive for displaying the batch of selected VCSEL light-emitting particles.

2. The projector according to claim 1, further comprising:
a diffractive optical element (DOE) that duplicates and splices the basic coded pattern emitted by the VCSEL light-emitting substrate.

3. The projector according to claim 1, wherein the VCSEL regular light-emitting lattice drives the VCSEL light-emitting particles according to an instruction from a display control module to form multiple frames of different basic coded patterns on a time axis, and the basic coded patterns, after being duplicated and spliced by the collimator and/or DOE, form a multi-frame speckle time-space coded pattern.

4. The projector according to claim 1, wherein the number of light-emitting particles is an integer, and the light-emitting particles are equidistantly arranged.

5. The projector according to claim 1, wherein the regular light-emitting lattice is of a square shape, a rectangular shape, a circular shape, a triangular shape, or a polygonal shape.

6. The projector according to claim 1, wherein the projected speckle coded pattern is composed of random speckles, or composed of regular symbol M-array codes, or composed of speckle plus regular symbol mixed codes.

7. The projector according to claim 1, wherein the X-Y direction driving module drives part of the VCSEL light-emitting particles by regions.

8. The projector according to claim 1, wherein the X-Y direction driving module changes light intensity of each light-emitting particle by adjusting magnitude of the current, forming a grayscale layer.

9. The projector according to claim 1, wherein the display control module controls projecting a fixed coded pattern to label a spatial object or controls time-division output of a plurality of different coded patterns to label the spatial object.

10. The projector according to claim 1, wherein the display control module selects, according to the coding rule, by batches, VCSEL light-emitting particles of a certain region; wherein light-emitting particles that are turned on in a preceding batch of selected regions are automatically turned on in a subsequent batch selection operation.

\* \* \* \* \*